(12) United States Patent
Yu et al.

(10) Patent No.: US 12,477,847 B2
(45) Date of Patent: Nov. 18, 2025

(54) METHOD OF MANUFACTURING SEMICONDUCTOR DEVICES WITH SYSTEM ON CHIP DEVICES

(71) Applicant: Taiwan Semiconductor Manufacturing Co., Ltd., Hsinchu (TW)

(72) Inventors: Chen-Hua Yu, Hsinchu (TW); Hsien-Wei Chen, Hsinchu (TW); Wen-Chih Chiou, Zhunan Township (TW); Ming-Fa Chen, Taichung (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/870,296

(22) Filed: Jul. 21, 2022

(65) Prior Publication Data

US 2022/0367466 A1 Nov. 17, 2022

Related U.S. Application Data

(62) Division of application No. 16/806,470, filed on Mar. 2, 2020, now Pat. No. 11,856,800.

(Continued)

(51) Int. Cl.
*H10F 39/00* (2025.01)
*H01L 21/56* (2006.01)
*H10B 12/00* (2023.01)

(52) U.S. Cl.
CPC ......... *H10F 39/804* (2025.01); *H10B 12/00* (2023.02); *H01L 21/56* (2013.01)

(58) Field of Classification Search
CPC ............. H10B 99/00; H10B 12/00; H01L 27/14618; H01L 21/56; H01L 2221/68345; H01L 2221/68359; H01L 21/4857; H01L 21/6835; H01L 23/49811; H01L 23/5383; H01L 23/49816; H01L 23/5389; H01L 24/80; H01L 2224/16145; H01L 2224/214; H01L 24/19; H01L 24/20; H01L 25/0652;
(Continued)

(56) References Cited

U.S. PATENT DOCUMENTS 7,619,901 B2 * 11/2009 Eichelberger ........... H01L 23/29
361/764
9,000,584 B2 4/2015 Lin et al.
(Continued)

FOREIGN PATENT DOCUMENTS

CN 109616441 A 4/2019
KR 20180030147 A 3/2018

*Primary Examiner* — Duy T Nguyen
(74) *Attorney, Agent, or Firm* — Slater Matsil, LLP

(57) ABSTRACT

A semiconductor device and method of manufacture are provided wherein the semiconductor device includes a first system on chip device bonded to a first memory device, a second system on chip device bonded to the first memory device, a first encapsulant surrounding the first system on chip device and the second system on chip device, a second encapsulant surrounding the first system on chip device, the second system on chip device, and the first memory device, and a through via extending from a first side of the second encapsulant to a second side of the first encapsulant, the through via being located outside of the first encapsulant.

20 Claims, 7 Drawing Sheets

Related U.S. Application Data

(60) Provisional application No. 62/903,439, filed on Sep. 20, 2019.

(58) Field of Classification Search
CPC .......... H01L 25/50; H01L 2224/04105; H01L 2224/08145; H01L 2224/12105; H01L 2224/24137; H01L 2224/32145; H01L 2224/48227; H01L 2224/73209; H01L 2224/73251; H01L 2224/73259; H01L 2224/73265; H01L 2224/73267; H01L 2224/80006; H01L 2224/80095; H01L 2224/80805; H01L 2224/80895; H01L 2224/80896; H01L 2224/81005; H01L 2225/0651; H01L 2225/06568; H01L 2225/1035; H01L 2225/1041; H01L 2225/1058; H01L 2924/15311; H01L 23/3128; H01L 23/3135; H01L 25/0657; H01L 25/105; H01L 25/16; H01L 25/18; H01L 21/561; H01L 21/568; H01L 23/528; H01L 23/495; H01L 23/49827; H01L 24/97; H10F 39/804

See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,559,081 B1* | 1/2017 | Lai | H01L 23/5389 |
| 9,754,917 B2* | 9/2017 | Wang | H01L 23/3135 |
| 10,629,540 B2 | 4/2020 | Yu et al. | |
| 2001/0038151 A1* | 11/2001 | Takahashi | H01L 24/94 257/E25.011 |
| 2007/0128828 A1* | 6/2007 | Chen | B81C 3/002 438/458 |
| 2008/0277800 A1 | 11/2008 | Hwang et al. | |
| 2012/0306097 A1* | 12/2012 | Kim | H01L 21/568 257/774 |
| 2013/0043584 A1* | 2/2013 | Kwon | H01L 24/06 257/737 |
| 2014/0124949 A1 | 5/2014 | Paek et al. | |
| 2014/0252646 A1* | 9/2014 | Hung | H01L 25/0657 257/774 |
| 2015/0115464 A1 | 4/2015 | Yu et al. | |
| 2015/0206865 A1* | 7/2015 | Yu | H01L 24/17 257/737 |
| 2015/0303174 A1 | 10/2015 | Yu et al. | |
| 2015/0318263 A1 | 11/2015 | Yu et al. | |
| 2016/0284677 A1* | 9/2016 | Lin | H01L 23/5384 |
| 2016/0293577 A1* | 10/2016 | Yu | H01L 23/3107 |
| 2016/0315071 A1 | 10/2016 | Zhai et al. | |
| 2016/0329298 A1* | 11/2016 | Lee | H01L 23/5386 |
| 2017/0084589 A1 | 3/2017 | Kuo et al. | |
| 2017/0141088 A1* | 5/2017 | Zhai | H01L 21/561 |
| 2017/0207197 A1* | 7/2017 | Yu | H01L 24/92 |
| 2018/0061741 A1 | 3/2018 | Beyne | |
| 2019/0019756 A1 | 1/2019 | Yu et al. | |
| 2019/0131277 A1* | 5/2019 | Yang | H01L 24/83 |
| 2019/0244947 A1* | 8/2019 | Yu | H01L 24/92 |
| 2019/0385929 A1 | 12/2019 | Ku et al. | |
| 2020/0020643 A1* | 1/2020 | Yu | H01L 23/49827 |
| 2020/0075546 A1* | 3/2020 | Shih | H01L 25/50 |

* cited by examiner

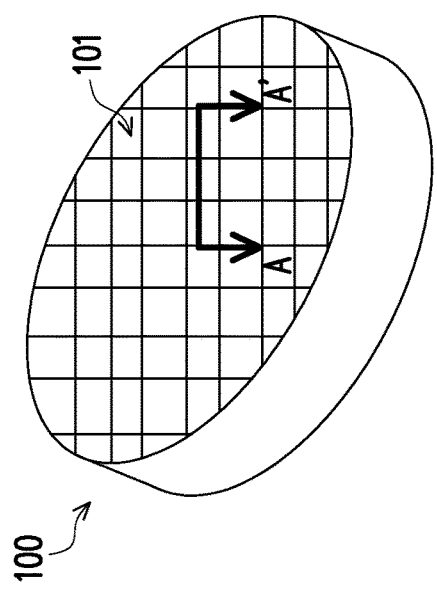
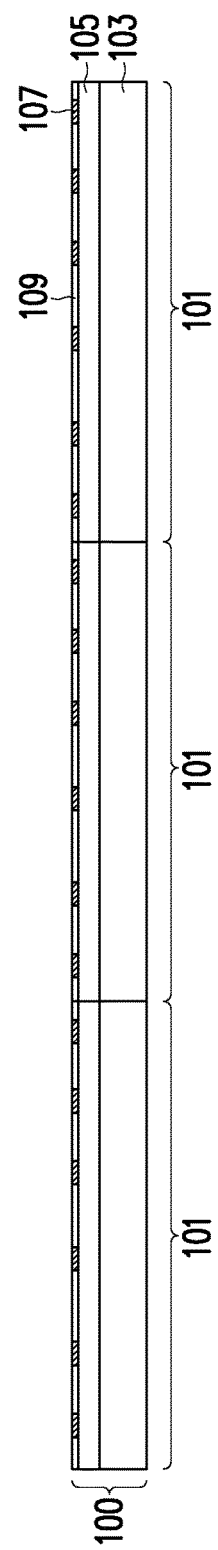
FIG. 1A
FIG. 1B

METHOD OF MANUFACTURING SEMICONDUCTOR DEVICES WITH SYSTEM ON CHIP DEVICES

PRIORITY CLAIM AND CROSS-REFERENCE

This application is a division of U.S. patent application Ser. No. 16/806,470, filed on Mar. 2, 2020, entitled "Semiconductor Devices with System on Chip Devices," which claims the benefits of U.S. Provisional Application No. 62/903,439, filed on Sep. 20, 2019, entitled "Semiconductor Devices and Methods of Manufacture," which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1B illustrate a semiconductor wafer with first semiconductor devices, in accordance with some embodiments.

DETAILED DESCRIPTION

Figure 2A:
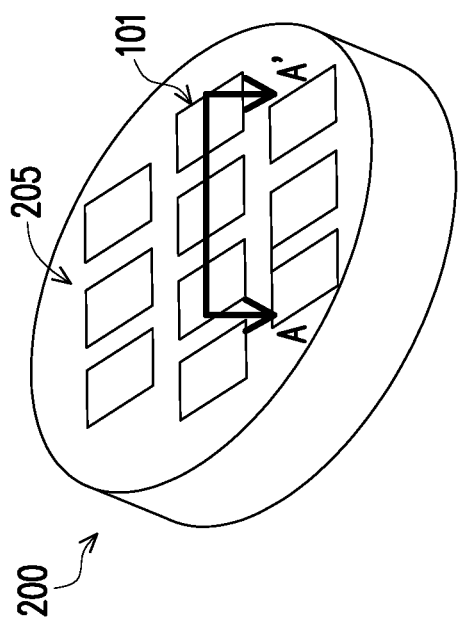
FIGS. 2A-2B illustrate a reconstructed wafer of the first semiconductor devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to specific embodiments which integrate a first system on chip device, a second system on chip device, and a wide I/O memory device with system on integrated circuit and integrated fan out technology in order to achieve a high performance and low cost structure. However, the embodiments described herein may be applied in a wide variety of structures and methods, and all such structures and methods are fully intended to be included within the scope of the embodiments.

With reference now to FIGS. 1A-1B, a semiconductor wafer 100 is illustrated with multiple first semiconductor devices 101 formed with and over the semiconductor wafer 100 (with FIG. 1B illustrating a cross-sectional view of FIG. 1A along line A-A'). In a particular embodiment the first semiconductor devices 101 may be a memory device, such as a wide I/O dynamic random access memory (DRAM) device which has a large number of I/O interfaces, such as greater than 256 interfaces, so that a large bandwidth of data may be realized even at low clock speeds. However, the first semiconductor devices 101 may also be any other suitable type of memory device with a high rate of data transfer, such as an LPDDRn memory device or the like, that has a high rate of data transfer, or may be any other suitable device, such as logic dies, central processing unit (CPU) dies, input/output dies, combinations of these, or the like. Additionally, the semiconductor wafer 100 may be received by the manufacturer from a third party manufacturer, or may be manufactured in house.

In an embodiment the first semiconductor devices 101 may comprise a first substrate 103, first active devices, first metallization layers 105, a first wafer bond layer 109, and first conductive wafer bond material 107. The first substrate 103 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor devices 101. The first active devices may be formed using any suitable methods either within or else on the first substrate 103.

The first metallization layers 105 are formed over the first substrate 103 and the first active devices and are designed to connect the various active devices to form functional circuitry. In an embodiment the first metallization layers 105 are formed of alternating layers of dielectric and conductive material and may be formed through any suitable process (such as deposition, damascene, dual damascene, etc.). In an embodiment there may be four layers of metallization separated from the first substrate 103 by at least one interlayer dielectric layer (ILD), but the precise number of first metallization layers 105 is dependent upon the design of the first semiconductor devices 101.

The first wafer bond layer 109 may be formed on the first substrate 103 over the first metallization layers 105. The first wafer bond layer 109 may be used for hybrid bonding or fusion bonding (also referred to as oxide-to-oxide bonding). In accordance with some embodiments, the first wafer bond layer 109 is formed of a silicon-containing dielectric material such as silicon oxide, silicon nitride, or the like. The first wafer bond layer 109 may be deposited using any suitable method, such as, atomic layer deposition (ALD), CVD, high-density plasma chemical vapor deposition (HDPCVD), PVD, or the like to a thickness of between about 1 nm and about 1000 nm, such as about 5 nm. However, any suitable material, process, and thickness may be utilized.

Once the first wafer bond layer 109 has been formed, bond openings may be formed within the first wafer bond layer 109 to prepare for the formation of the first conductive wafer bond material 107. In an embodiment the bond openings may be formed by first applying and patterning a photoresist over the top surface of the first wafer bond layer 109. The photoresist is then used to etch the first wafer bond layer 109 in order to form the openings. The first wafer bond layer 109 may be etched by dry etching (e.g., reactive ion etching (RIE) or neutral beam etching (NBE)), wet etching, or the like. In accordance with some embodiments of the present disclosure, the etching stops on the first metallization layers 105 such that the first metallization layers 105 are exposed through the openings in the first wafer bond layer 109.

Once the first metallization layers 105 have been exposed, the first conductive wafer bond material 107 may be formed in physical and electrical contact with the first metallization layers 105. In an embodiment the first conductive wafer bond material 107 may comprise a barrier layer, a seed layer, a fill metal, or combinations thereof (not separately illustrated). For example, the barrier layer may be blanket deposited over the first metallization layers 105. The barrier layer may comprise titanium, titanium nitride, tantalum, tantalum nitride, or the like. The seed layer may be a conductive material such as copper and may be blanket deposited over the barrier layer using processes such as sputtering, evaporation, or plasma-enhanced chemical vapor deposition (PECVD), or the like, depending upon the desired materials. The fill metal may be a conductor such as copper or a copper alloy and may be deposited over the seed layer to fill or overfill the openings through a plating process such as electrical or electroless plating. Once the fill metal has been deposited, excess material of the fill metal, the seed layer, and the barrier layer may be removed from outside of the openings through a planarization process such as chemical mechanical polishing. However, while a single damascene process has been described, any suitable method, such as a dual damascene process, may also be utilized.

However, the above described embodiment in which the first wafer bond layer 109 is formed, patterned, and the first conductive wafer bond material 107 is plated into opening before being planarized is intended to be illustrative and is not intended to be limiting upon the embodiments. Rather, any suitable method of formation of the first wafer bond layer 109 and the first conductive wafer bond material 107 may be utilized. In other embodiments, the first conductive wafer bond material 107 may be formed first using, for example, a photolithographic patterning and plating process, and then dielectric material is used to gap fill the area around the first conductive wafer bond material 107 before being planarized using a CMP. Any such manufacturing process is fully intended to be included within the scope of the embodiments.

Figure 2B:
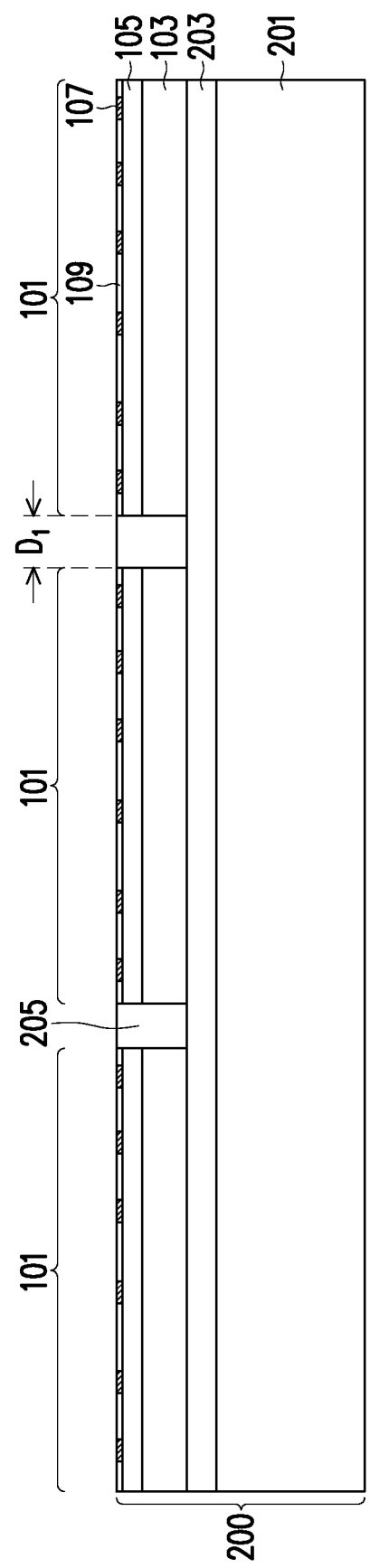

FIGS. 2A-2B illustrate an optional process whereby the first semiconductor devices 101 are tested, separated, and then are used to form a re-constructed wafer 200 with only known good dies (KGDs) for further processing (with FIG. 2B illustrating a cross-sectional view of FIG. 2A along line B-B'). In particular, in some manufacturing processes the semiconductor wafer 100 may have a low yield (e.g., 10 or less good dies out of at least 100 dies manufactured on the semiconductor wafer 100). As such, the first semiconductor devices 101 may be tested in order to ensure that each of the first semiconductor devices 101 meet all of the desired specifications for the desired design. For example, test probes may be placed in electrical connection with each of the first semiconductor devices 101 and signals may be input into and received from the first semiconductor devices 101 in order to test the first semiconductor devices 101.

Once the testing has been performed and the first semiconductor devices 101 have been identified as known good or bad, the semiconductor wafer 100 (see, e.g., FIGS. 1A-1B) may be singulated to separate the known good first semiconductor devices 101 from the defective first semiconductor devices 101. In an embodiment the singulation may be performed by using a saw blade (not shown) to slice through the first substrate 103 between the first semiconductor devices 101, thereby separating one of the first semiconductor devices 101 from another one of the first semiconductor devices 101.

However, as one of ordinary skill in the art will recognize, utilizing a saw blade to singulate the first semiconductor devices 101 is merely one illustrative embodiment and is not intended to be limiting. Other methods for singulating the first semiconductor devices 101, such as utilizing one or more etches to separate the first semiconductor devices 101, may alternatively be utilized. These methods and any other suitable methods may alternatively be utilized to singulate the first semiconductor devices 101.

Once the first semiconductor devices 101 have been singulated, those ones of the first semiconductor devices 101 that have passed testing and are known to be good are placed onto a first carrier substrate 201 using a first adhesion layer 203. In an embodiment the first carrier substrate 201 comprises, for example, silicon based materials, such as glass or silicon oxide, or other materials, such as aluminum oxide, combinations of any of these materials, or the like. The first carrier substrate 201 is planar in order to accommodate the attachment of the first semiconductor devices 101.

The first adhesion layer 203 is placed over the first carrier substrate 201 and is utilized in order to provide protection to, e.g., the first semiconductor devices 101 once the first semiconductor devices 101 have been attached. In an embodiment the first adhesion layer 203 is a dielectric such as an epoxy-based thermal-release material, which loses its adhesive property when heated, such as a light-to-heat-conversion (LTHC) release coating. In other embodiments, the first adhesion layer 203 may be an ultra-violet (UV) glue, which loses its adhesive property when exposed to UV lights. The first adhesion layer 203 may be dispensed as a liquid and cured, may be a laminate film laminated onto the first carrier substrate 201, or the like.

Once the first adhesion layer 203 has been placed on the first carrier substrate 201, the known good dies of the first semiconductor devices 101 may be placed adjacent to each other on the first adhesion layer 203. In an embodiment the first semiconductor devices 101 that are known good may be placed using, for example, a pick-and-place process. However, any suitable method may be utilized to place the first semiconductor devices 101.

In an embodiment a first one of the first semiconductor devices 101 may be placed a first distance $D_1$ away from a second one of the first semiconductor devices 101. While the specific first distance $D_1$ to be used is dependent upon a number of factors such as the size of the first semiconductor devices 101, in an embodiment in which the first semiconductor devices 101 are 6 mm, the first distance $D_1$ may be between about 10 μm and about 500 μm, such as about 80 μm. However, any suitable distance may be utilized.

After the first semiconductor devices 101 have been placed, the first semiconductor devices 101 may be encapsulated. The encapsulation may be performed in a molding device, which may comprise a top molding portion and a bottom molding portion separable from the top molding portion. When the top molding portion is lowered to be adjacent to the bottom molding portion, a molding cavity may be formed for the first carrier substrate 201 and the first semiconductor devices 101.

During the encapsulation process the top molding portion may be placed adjacent to the bottom molding portion, thereby enclosing the first carrier substrate 201 and the first semiconductor devices 101 within the molding cavity. Once enclosed, the top molding portion and the bottom molding portion may form an airtight seal in order to control the influx and outflux of gasses from the molding cavity. Once sealed, an encapsulant 205 may be placed within the molding cavity.

The encapsulant 205 may be an epoxy or a molding compound resin such as polyimide, polyphenylene sulfide (PPS), polyetheretherketone (PEEK), poly ether sulphone (PES), a heat resistant crystal resin, combinations of these, or the like. The encapsulant 205 may be placed within the molding cavity prior to the alignment of the top molding portion and the bottom molding portion, or else may be injected into the molding cavity through an injection port, using compression molding, transfer molding, or the like.

Once the encapsulant 205 is placed into the molding cavity such that the encapsulant 205 encapsulates the first carrier substrate 201 and the first semiconductor devices 101, the encapsulant 205 may be cured in order to harden the encapsulant 205 for optimum protection. While the exact curing process is dependent at least in part on the particular material chosen for the encapsulant 205, in an embodiment in which molding compound is chosen as the encapsulant 205, the curing could occur through a process such as heating the encapsulant 205 to between about 100° C. and about 200° C., such as about 125° C. for about 60 sec to about 3000 sec, such as about 600 sec. Additionally, initiators and/or catalysts may be included within the encapsulant 205 to better control the curing process.

However, as one having ordinary skill in the art will recognize, the curing process described above is merely an exemplary process and is not meant to limit the current embodiments. Other curing processes, such as irradiation or even allowing the encapsulant 205 to harden at ambient temperature, may also be used. Any suitable curing process may be used, and all such processes are fully intended to be included within the scope of the embodiments discussed herein.

FIG. 2B further illustrates a thinning of the encapsulant 205 in order to expose the first semiconductor devices 101 for further processing. The thinning may be performed, e.g., using a mechanical grinding, chemical approaches, or chemical mechanical polishing (CMP) process whereby chemical etchants and abrasives are utilized to react and grind away the encapsulant 205 and the first semiconductor devices 101 so that the first conductive wafer bond material 107 on the first semiconductor devices 101 have been exposed. As such, the first semiconductor devices 101 may have a planar surface that is also coplanar with the encapsulant 205. In another embodiment, the grinding may be omitted. For example, if the first semiconductor devices 101 are already exposed after encapsulation, the grinding may be omitted.

Furthermore, while the CMP process described above is presented as one illustrative embodiment, it is not intended to be limiting to the embodiments. Any other suitable removal process may be used to thin the encapsulant 205 and the first semiconductor devices 101. For example, a series of chemical etches may be utilized. This process and any other suitable process may be utilized to planarize the encapsulant 205 and the first semiconductor devices 101, and all such processes are fully intended to be included within the scope of the embodiments.

However, while the formation of the re-constructed wafer 200 can be used to help ensure that only known good dies are utilized, the formation of the re-constructed wafer 200 is intended to be illustrative and is not intended to be limiting. Rather, the original semiconductor wafer 100 can be used without forming the re-constructed wafer 200. Such embodiments are fully intended to be included within the scope of the embodiments.

Figure 3A:
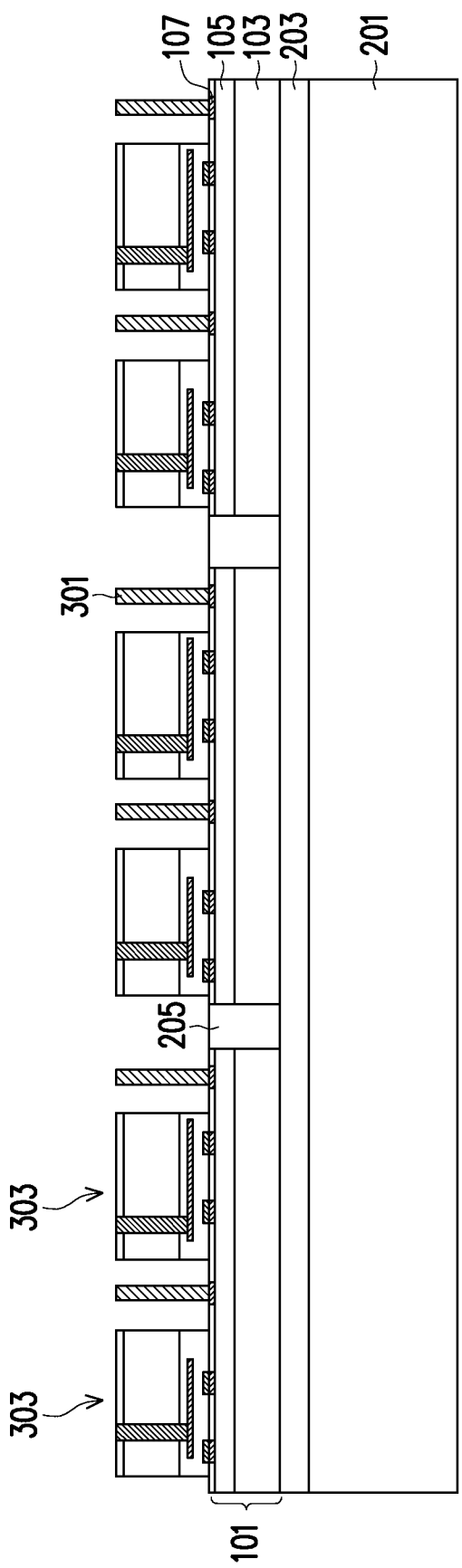
FIGS. 3A-3B illustrate a bonding of second semiconductor devices to the first semiconductor devices, in accordance with some embodiments.

FIG. 3A illustrates that, once the re-constructed wafer 200 has been formed, through integrated fan out vias (TIVs) 301 may be formed on the re-constructed wafer 200. In an embodiment the TIVs 301 may be formed by initially forming a seed layer over the re-constructed wafer 200. In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as physical vapor deposition, evaporation, or PECVD processes, or metal foil laminating process, or the like, depending upon the desired materials. The seed layer may be formed to have a thickness of between about 0.3 μm and about 1 μm, such as about 0.5 μm.

After the seed layer has been formed, a photoresist is placed and patterned over the seed layer. In an embodiment the photoresist may be placed on the seed layer using, e.g., a spin coating technique to a height of between about 50 μm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for TIVs 301. The TIVs 301 are formed in such a placement as to be located on different sides of subsequently attached devices such as the second semiconductor devices 303. However, any suitable arrangement for the pattern of TIVs 301, such as by being located such that the second semiconductor devices 303 are placed on opposing sides of the TIVs 301, may also be utilized.

In an embodiment the TIVs 301 are formed within the photoresist. In an embodiment the TIVs 301 comprise one or more conductive materials, such as copper, tungsten, other conductive metals, or the like, and may be formed, for example, by electroplating, electroless plating, or the like. In an embodiment, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the TIVs 301 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the TIVs 301) may be removed by, for example, one or more wet or dry etching processes. For example, in a dry etching process reactants may be directed towards the seed layer using the TIVs 301 as masks. In another embodiment, etchants may be sprayed or otherwise put into contact with the seed layer in order to remove the exposed portions of the seed layer. After the exposed portion of the seed layer has been etched away, a portion of the re-constructed wafer 200 is exposed between the TIVs 301.

After the TIVs 301 have been formed, second semiconductor devices 303 may be placed adjacent to the TIVs 301. In an embodiment the second semiconductor devices 303 may each be a system on chip device, such as a logic device, which is intended to work in conjunction with the first semiconductor device 101 (e.g., the wide I/O DRAM devices). However, any suitable functionality, such as logic dies, central processing unit (CPU) dies, input/output dies, combinations of these, or the like, may be utilized.

Figure 3B:
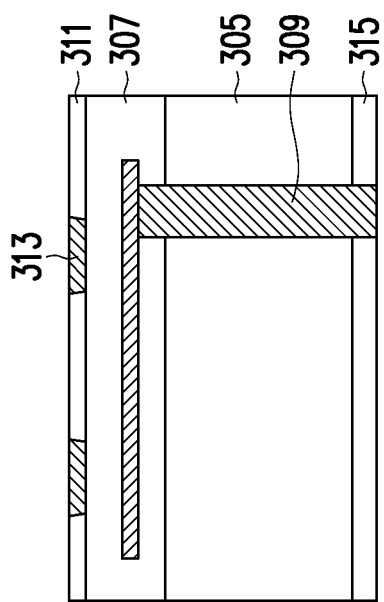

FIG. 3B illustrates a close-up view of the second semiconductor devices 303, and illustrates that the second semiconductor devices 303 may comprise second substrates 305, second active devices, second metallization layers 307, through silicon vias (TSVs) 309, second wafer bond layers 311, and second conductive wafer bond material 313. In an embodiment the second substrates 305, second active devices, second metallization layers 307, second wafer bond layers 311, and second conductive wafer bond material 313 may be formed similar to the first substrate 103, the first active devices, the first metallization layers 105, the first wafer bond layer 109, and the first conductive wafer bond material 107, described above with respect to FIGS. 1A-1B. However, in other embodiments these structures may be formed using different processes.

Additionally, in some embodiments the second semiconductor devices 303 may be formed to include the TSVs 309, which provide electrical connectivity from a front side of the second semiconductor devices 303 (e.g., a face side) where the second active devices are located to a back side of the second semiconductor devices 303. In an embodiment the TSVs 309 may be formed by initially forming through silicon via (TSV) openings into the second substrates 305 and, if desired, any overlying second metallization layers 307. The TSV openings may be formed by applying and developing a suitable photoresist, and removing portions of the second substrates 305 that are exposed to a desired depth. The TSV openings may be formed so as to extend into the second substrates 305 to a depth greater than the eventual desired height of the second substrates 305. Accordingly, while the depth is dependent upon the overall designs, the depth may be between about 20 µm and about 200 µm, such as a depth of about 50 µm.

Once the TSV openings have been formed within the second substrates 305 and or any second metallization layers 307, the TSV openings may be lined with a liner. The liner may be, e.g., an oxide formed from tetraethylorthosilicate (TEOS) or silicon nitride, although any suitable dielectric material may be used. The liner may be formed using a plasma enhanced chemical vapor deposition (PECVD) process, although other suitable processes, such as physical vapor deposition or a thermal process, may be used. Additionally, the liner may be formed to a thickness of between about 0.1 µm and about 5 µm, such as about 1 µm.

Once the liner has been formed along the sidewalls and bottom of the TSV openings, a barrier layer may be formed and the remainder of the TSV openings may be filled with first conductive material. The first conductive material may comprise copper, although other suitable materials such as aluminum, alloys, doped polysilicon, combinations thereof, and the like, may be utilized. The first conductive material may be formed by electroplating copper onto a seed layer, filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used.

Once the TSV openings have been filled, a thinning of the back side of the second substrates 305 in order to expose the openings for the TSVs 309 and form the TSVs 309 from the conductive material that extends through the second substrates 305. In an embodiment, the thinning of the second side of the second substrates 305 may leave the TSVs 309 exposed. The thinning of the second side of the second substrate 305 may be performed by a planarization process such as CMP or etching.

Additionally, if desired, the back side of the second substrates 305 may then be recessed to allow the TSVs 309 to protrude from the back side of the second substrates 305. In an embodiment the recessing may be performed using an etching process, such as a dry etching process, although any suitable process may be utilized. In an embodiment the TSVs 309 may protrude from the back side of the second substrates 305 a distance of between about 0.5 μm and about 10 μm, such as about 5 μm.

Once the TSVs 309 protrude from the second substrate 305, a passivation layer 315 may be formed in order to protect the TSVs 309. In an embodiment the passivation layer 315 may be made of one or more suitable dielectric materials such as silicon oxide, silicon nitride, a polymer such as polybenzoxazole (PBO), a molding compound, a low-k dielectric such as carbon doped oxides, extremely low-k dielectrics such as porous carbon doped silicon dioxide, combinations of these, or the like. The passivation layer 315 may be formed through a low temperature chemical vapor deposition (LTCVD), although any suitable deposition process, such as CVD, PVD, ALD, a molding process, combinations of these, or the like, may also be utilized. After the passivation layer 315 has been formed, the passivation layer 315 may also be thinned in order to again expose the TSVs 309. In an embodiment a chemical mechanical polishing process may be used to thin the passivation layer 315 until the TSVs 309 have been exposed.

Once the second semiconductor devices 303 have been prepared, the second semiconductor devices 303 are bonded to the first semiconductor devices 101 using, for example, hybrid bonding. In an embodiment the surfaces of the first semiconductor devices 101 (e.g., the first wafer bond layer 109 and the first conductive wafer bond material 107) and the surfaces of the second semiconductor devices 303 (e.g., the second wafer bond layers 311 and the second conductive wafer bond material 313) may initially be activated. Activating the top surfaces of the first semiconductor devices 101 and the second semiconductor devices 303 may comprise a dry treatment, a wet treatment, a plasma treatment, exposure to an inert gas plasma, exposure to $H_2$, exposure to $N_2$, exposure to $O_2$, or combinations thereof, as examples. In embodiments where a wet treatment is used, an RCA cleaning may be used, for example. In another embodiment, the activation process may comprise other types of treatments. The activation process assists in the hybrid bonding of the first semiconductor devices 101 and the second semiconductor devices 303.

After the activation process, the first semiconductor devices 101 and the second semiconductor devices 303 may be placed into contact. In a particular embodiment in which hybrid bonding is utilized, the first conductive wafer bond material 107 is placed into physical contact with the second conductive wafer bond material 313 while the first wafer bond layer 109 is placed into physical contact with the second wafer bond layers 311. With the activation process chemically modifying the surfaces, the bonding process between the materials is begun upon the physical contact.

Once physical contact has begun the bonding process, the bonding may then be strengthened by subjecting the assembly to a thermal treatment. In an embodiment the first semiconductor devices 101 and the second semiconductor devices 303 may be subjected to a temperature between about 200° C. and about 400° C. to strengthen the bond between the first wafer bond layer 109 and the second wafer bond layers 311. The first semiconductor devices 101 and the second semiconductor devices 303 may then be subjected to a temperature at or above the eutectic point for material of the first conductive wafer bond material 107 and the second conductive wafer bond material 313. In this manner, fusion of the first semiconductor devices 101 and the second semiconductor devices 303 forms a hybrid bonded device.

Additionally, while specific processes have been described to initiate and strengthen the hybrid bonds between the first semiconductor devices 101 and the second semiconductor devices 303, these descriptions are intended to be illustrative and are not intended to be limiting upon the embodiments. Rather, any suitable combination of baking, annealing, pressing, or other bonding processes or combination of processes may be utilized. All such processes are fully intended to be included within the scope of the embodiments.

Additionally, while hybrid bonding has been described as one method of bonding the first semiconductor devices 101 to the second semiconductor devices 303, this as well is only intended to be illustrative and is not intended to be limiting upon the embodiments. Rather, any suitable method of bonding, such as fusion bonding, copper-to-copper bonding, or the like, or even solder bonding using, e.g., a ball grid array, may also be utilized. Any suitable method of bonding the first semiconductor devices 101 to the second semiconductor devices 303 may be utilized.

Figure 4:
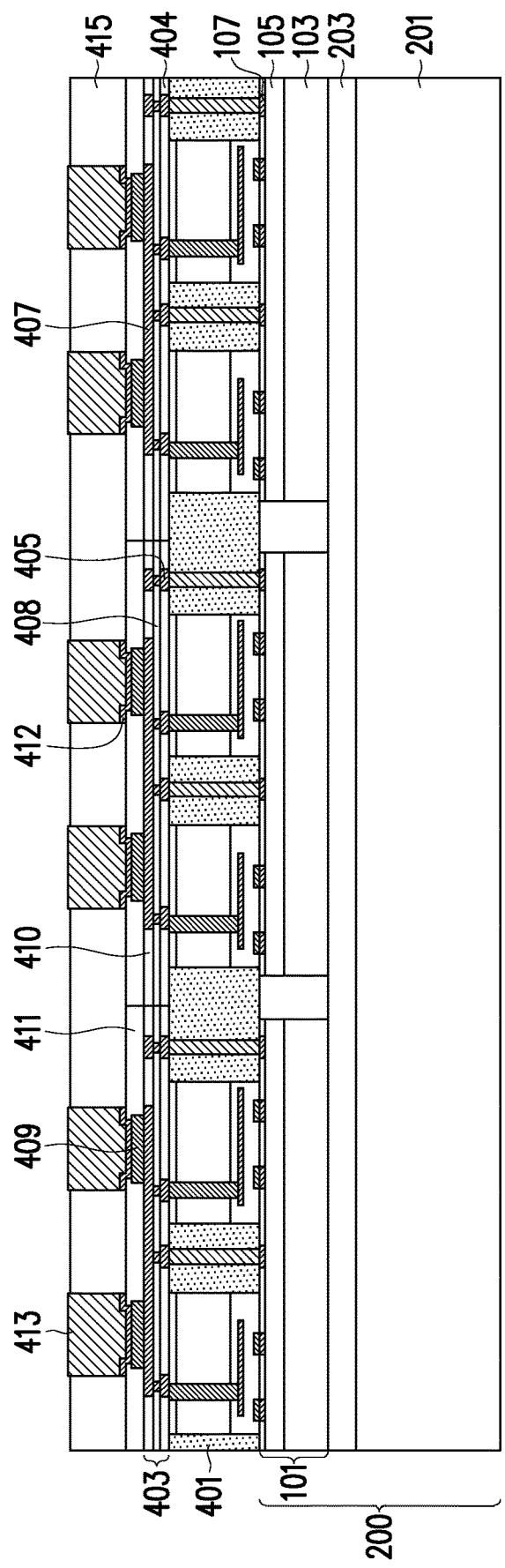
FIG. 4 illustrates an encapsulation of the second semiconductor devices, in accordance with some embodiments.

FIG. 4 illustrates that, once the second semiconductor devices 303 have been bonded to the first semiconductor devices 101, the second semiconductor devices 303, the first semiconductor devices 101, and the TIVs 301 may be encapsulated with a second encapsulant 401. In an embodiment the second semiconductor devices 303, the first semiconductor devices 101, and the TIVs 301 may be encapsulated using a process similar to the encapsulation of the first semiconductor devices 101 as described above with respect to FIGS. 2A-2B. Once encapsulated, the second semiconductor devices 303, the first semiconductor devices 101, the TIVs 301 and the second encapsulant 401 may be planarized to expose the TIVs 301 and the TSVs 309.

In another embodiment, instead of encapsulating the second semiconductor devices 303 and the TIVs 301 with an encapsulant such as a molding compound, the second semiconductor devices 303 and the TIVs 301 can be encapsulated with a gap fill dielectric material (in which the TIVs 301 can be considered a through dielectric via (TDV)). In some embodiments, the gap fill dielectric material may comprise a non-polymer like silicon dioxide, silicon nitride, or the like, such as another oxide or nitride, which is deposited using any suitable process. For example, the gap-fill material may be formed by CVD, PECVD or ALD deposition process, FCVD, or a spin-on-glass process. However, any suitable material and any suitable deposition process may be utilized.

In yet another embodiment in which a gap fill material is utilized for the second encapsulant 401, instead of forming the TIVs 301 prior to formation and/or placement of the second encapsulant 401, the TIVs 301 (or TDVs) may be formed after the formation and/or placement of the second encapsulant 401. In such an embodiment the second semiconductor devices 303 may be placed and the gap fill material may be placed to encapsulate the second semiconductor devices 303. Once the gap fill material has been placed, a photolithographic masking and etching process may be used to form openings through the gap fill material between the second semiconductor devices 303 in order to expose the underlying first conductive wafer bond material 107.

Once the openings have been formed, the openings may be filled with a conductive material including, in some embodiments, a liner. The liner may be, e.g., an oxide formed from tetraethylorthosilicate (TEOS) or silicon nitride, although any suitable dielectric material may be used. The liner may be formed using a plasma enhanced chemical vapor deposition (PECVD) process, although other suitable processes, such as physical vapor deposition or a thermal process, may be used. Additionally, the liner may be formed to a thickness of between about 0.1 µm and about 5 µm, such as about 1 µm.

Once the liner has been formed along the sidewalls and bottom of the openings, a barrier layer may be formed and the remainder of the openings may be filled with conductive material. The conductive material may comprise copper, although other suitable materials such as aluminum, alloys, doped polysilicon, combinations thereof, and the like, may be utilized. The conductive material may be formed by electroplating copper onto a seed layer, filling and overfilling the TSV openings. Once the openings have been filled, excess liner, barrier layer, seed layer, and conductive material outside of the openings may be removed through a planarization process such as chemical mechanical polishing (CMP), although any suitable removal process may be used.

FIG. 4 additionally illustrates formation of a redistribution structure 403 with one or more layers over the second encapsulant 401. In an embodiment the redistribution structure 403 may be formed by initially forming a first redistribution passivation layer 404 over the second encapsulant 401. In an embodiment the first redistribution passivation layer 404 may be polybenzoxazole (PBO), although any suitable material, such as polyimide or a polyimide derivative, such as a low temperature cured polyimide, may alternatively be utilized. The first redistribution passivation layer 404 may be placed using, e.g., a spin-coating process to a thickness of between about 5 µm and about 17 µm, such as about 7 µm, although any suitable method and thickness may alternatively be used.

Once the first redistribution passivation layer 404 has been formed, first redistribution vias 405 may be formed through the first redistribution passivation layer 404 in order to make electrical connections to the second semiconductor devices 303 and the TIVs 301. In an embodiment the first redistribution vias 405 may be formed by using, e.g., a damascene process whereby the first redistribution passivation layer 404 is initially patterned to form openings using, e.g., a photolithographic masking and etching process or, if the material of the first redistribution passivation layer 404 is photosensitive, exposing and developing the material of the first redistribution passivation layer 404. Once patterned, the openings are filled with a conductive material such as copper and any excess material is removed using, e.g., a planarization process such as chemical mechanical polishing. However, any suitable process or materials may be utilized.

After the first redistribution vias 405 have been formed, a first redistribution layer 407 is formed over and in electrical connection with the first redistribution vias 405. In an embodiment the first redistribution layer 407 may be formed by initially forming a second redistribution passivation layer 408. In an embodiment the second redistribution passivation layer 408 may be polybenzoxazole (PBO), although any suitable material, such as polyimide or a polyimide derivative, such as a low temperature cured polyimide, may alternatively be utilized. The second redistribution passivation layer 408 may be placed using, e.g., a spin-coating process to a thickness of between about 5 µm and about 17 µm, such as about 7 µm, although any suitable method and thickness may alternatively be used.

Once the second redistribution passivation layer 408 has been formed, an opening may be patterned through the second redistribution passivation layer 408 to expose the first redistribution vias 405 using, e.g., a photolithographic etching process. Once expose, a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 407 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 4 µm. However, while the material and methods discussed are suitable to form the conductive material, these materials are merely exemplary. Any other suitable materials, such as AlCu or Au, and any other suitable processes of formation, such as CVD or PVD, may be used to form the first redistribution layer 407.

Once the conductive material has been formed, the photoresist may be removed through a suitable removal process such as chemical stripping and/or ashing. Additionally, after the removal of the photoresist, those portions of the seed layer that were covered by the photoresist may be removed through, for example, a suitable etch process using the conductive material as a mask.

Once the conductive material has been formed, a third redistribution passivation layer 410 may be formed. In an embodiment the third redistribution passivation layer 410 may be polybenzoxazole (PBO), although any suitable material, such as polyimide or a polyimide derivative, such as a low temperature cured polyimide, may alternatively be utilized. The third redistribution passivation layer 410 may be placed using, e.g., a spin-coating process to a thickness of between about 5 µm and about 17 µm, such as about 7 µm, although any suitable method and thickness may alternatively be used.

Once the redistribution structure 403 has been formed, contact pads 409 may be formed. The contact pads 409 may comprise aluminum, but other materials, such as copper, may also be used. The contact pads 409 may be formed using a deposition process, such as sputtering, to form a layer of material (not shown) and portions of the layer of material may then be removed through a suitable process (such as photolithographic masking and etching) to form the contact pads 409. However, any other suitable process may be utilized. The contact pads 409 may be formed to have a thickness of between about 0.5 µm and about 4 µm, such as about 1.45 µm. However, any suitable thickness may be used.

A passivation layer 411 may be formed over the contact pads 409. The passivation layer 411 is deposited over the wafer using, for example, a curable resin or polyimide coating (e.g., polyimide (PI), polybenzoxazole (PBO), epoxy films, or the like) in order to form the passivation layer 411. The passivation layer 411 may be deposited via a spin-on technique and then cured using, e.g., a low temperature curing technique. However, any suitable coatings, any suitable deposition techniques, and any suitable curing techniques may also be used.

Once the passivation layer 411 has been formed, under-bump metallizations (UBM) 412 and first external connectors 413 may be formed. In an embodiment the UBM 412 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 412. Any suitable materials or layers of material that may be used for the UBM 412 are fully intended to be included within the scope of the embodiments.

In an embodiment the UBM 412 is created by forming each layer over and through the passivation layer 411 to make physical and electrical contact with the contact pads 409. The forming of each layer may be performed using a plating process, such as electrochemical plating, although other processes of formation, such as sputtering, evaporation, or PECVD process, may alternatively be used depending upon the desired materials. The UBM 412 may be formed to have a thickness of between about 0.7 µm and about 10 µm, such as about 5 µm.

The first external connectors 413 may be a conductive pillar, such as a copper pillar. In an embodiment the conductive pillar may be formed by initially forming a seed layer and then applying and patterning a photoresist with openings exposing the seed layer where the conductive pillar is desired to be located. Conductive material, such as copper, tungsten, other conductive metals, or the like, may then be formed within the photoresist using a process such as electroplating, electroless plating, or the like. Once formed, the photoresist is removed and the seed layer is patterned using the conductive material as a mask.

Once the first external connectors 413 have been formed, a second passivation layer 415 is formed to protect the first external connectors 413. In an embodiment the second passivation layer 415 may be made of one or more suitable dielectric materials such as silicon oxide, silicon nitride, low-k dielectrics such as carbon doped oxides, extremely low-k dielectrics such as porous carbon doped silicon dioxide, combinations of these, or the like using a process such as CVD, PVD, ALD, combinations of these, or the like. However, any suitable materials and processes may be utilized.

Figure 5:
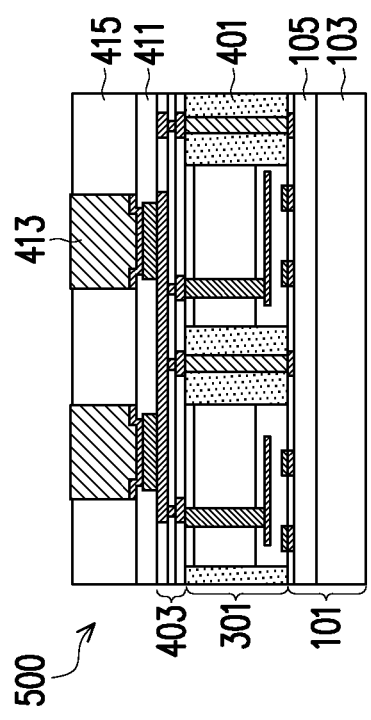
FIG. 5 illustrates a singulation process, in accordance with some embodiments.

FIG. 5 illustrates a removal of the first carrier substrate 201 and the first adhesive layer 203 and a singulation of the re-constructed wafer 200 to form a first semiconductor structure 500. In an embodiment the first carrier substrate 201 may be removed by directed energy at the first adhesion layer 203, thereby reducing its adhesion and allowing both the first adhesion layer 203 and the first carrier substrate 201 to be removed.

Once separated from the first carrier substrate 201, the re-constructed wafer 200 is singulated. In an embodiment the singulation may be performed by using a saw blade (not shown) to slice through the re-constructed wafer 200 between the first semiconductor devices 101, thereby separating one of the first semiconductor devices 101 (with each of the second semiconductor devices 303 bonded to it) from another one of the first semiconductor devices 101 (with each of the second semiconductor devices 303 bonded to it).

Figure 6:
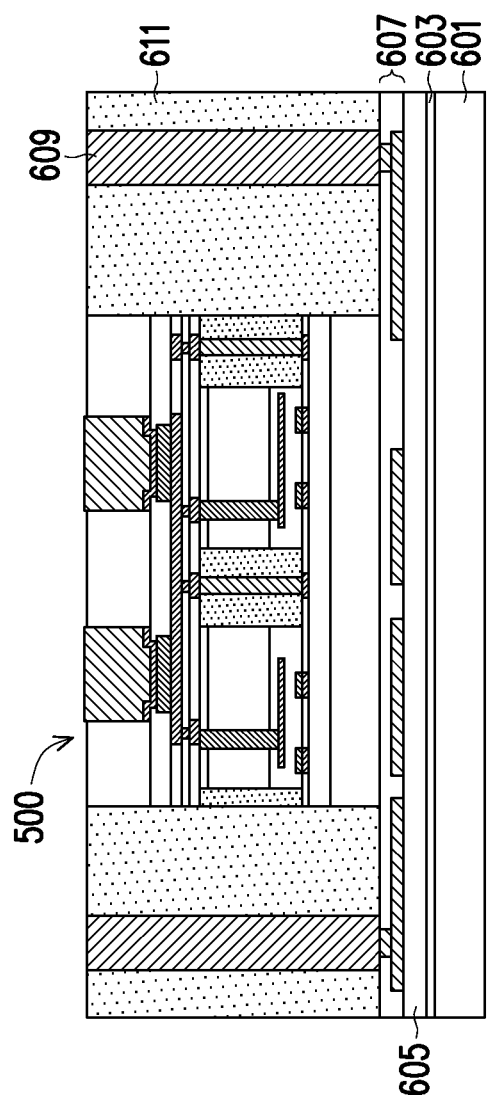
FIG. 6 illustrates an integrated fan out process, in accordance with some embodiments.

FIG. 6 illustrates another integrated fan out process which utilizes a second carrier substrate 601, a second adhesion layer 603, a polymer layer 605, a first redistribution layer 607, and second through integrated fan out vias (TIVs) 609. In an embodiment the second carrier substrate 601 comprises, for example, silicon based materials, such as glass or silicon oxide, or other materials, such as aluminum oxide, combinations of any of these materials, or the like. The second carrier substrate 601 is planar in order to accommodate an attachment of devices such as the first semiconductor structure 500.

The second adhesion layer 603 may be placed over the second carrier substrate 601 in order to assist in the attachment of overlying structures to the second carrier substrate 601. In an embodiment the second adhesion layer 603 is a die attached film (DAF), such as an epoxy resin, a phenol resin, acrylic rubber, silica filler, or a combination thereof, and is applied using a lamination technique. However, any other suitable material and method of formation may be utilized.

The polymer layer 605 is initially formed over the second adhesion layer 603. In an embodiment the polymer layer 605 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The polymer layer 605 may be formed through a process such as chemical vapor deposition (CVD), although any suitable process may be utilized, and may have a thickness between about 0.5 µm and about 5 µm.

Once the polymer layer 605 has been formed, underbump metallization layers and the first redistribution layers 607 may be formed over the polymer layer 605. In an embodiment the underbump metallization layers may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallization layers. Any suitable materials or layers of material that may be used for the underbump metallization layers are fully intended to be included within the scope of the embodiments.

In an embodiment the underbump metallization layers are created by forming each layer over the polymer layer 605. The forming of each layer may be performed using a plating process, such as electrochemical plating, although other processes of formation, such as sputtering, evaporation, or PECVD process, may alternatively be used depending upon the desired materials. The underbump metallization layers may be formed to have a thickness of between about 0.7 µm and about 10 µm, such as about 5 µm.

In an embodiment the first redistribution layers 607 comprise a series of conductive layers embedded within a series of dielectric layers. In an embodiment, a first one of the series of dielectric layers is formed over the polymer layer 605, and the first one of the series of dielectric layers may be a material such as polybenzoxazole (PBO), although any suitable material, such as polyimide or a polyimide derivative, may be utilized. The first one of the series of dielectric layers may be placed using, e.g., a spin-coating process, although any suitable method may be used.

After the first one of the series of dielectric layers has been formed, openings may be made through the first one of the series of dielectric layers by removing portions of the first one of the series of dielectric layers. The openings may be formed using a suitable photolithographic mask and etching process, although any suitable process or processes may be used to pattern the first one of the series of dielectric layers.

Once the first one of the series of dielectric layers has been formed and patterned, a first one of the series of conductive layers is formed over the first one of the series of dielectric layers and through the openings formed within the first one of the series of dielectric layers. In an embodiment the first one of the series of conductive layers may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first one of the series of conductive layers is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers has been formed, a second one of the series of dielectric layers and a second one of the series of conductive layers may be formed by repeating steps similar to the first one of the series of dielectric layers and the first one of the series of conductive layers. These steps may be repeated as desired in order to electrically connect each of the series of conductive layers to an underlying one of the series of conductive layers, and may be repeated as often as desired until an uppermost one of the series of conductive layers and an uppermost one of the series of dielectric layers has been formed. In an embodiment the deposition and patterning of the series of conductive layers and the series of dielectric layers may be continued until the first redistribution layers 607 have a desired number of layers, although any suitable number of individual layers may be utilized.

Once the first redistribution layers 607 have been formed over the second carrier substrate 601, the second TIVs 609 are formed in electrical connection with the first redistribution layers 607. In an embodiment the second TIVs 609 may be formed by initially forming a seed layer (not separately illustrated). In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as sputtering, evaporation, or PECVD processes, depending upon the desired materials. The seed layer may be formed to have a thickness of between about 0.3 µm and about 1 µm, such as about 0.5 µm.

Once the seed layer has been formed, a photoresist (also not illustrated) is placed over the seed layer. In an embodiment the photoresist may be placed on the seed layer using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. In an embodiment the pattern formed into the photoresist is a pattern for the second TIVs 609. The second TIVs 609 are formed in such a placement as to be located on different sides of subsequently attached devices. However, any suitable arrangement for the pattern of second TIVs 609 may be utilized.

In an embodiment the second TIVs 609 are formed within the photoresist from one or more conductive materials, such as copper, tungsten, other conductive metals, or the like, and may be formed, for example, by electroplating, electroless plating, or the like. For example, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the second TIVs 609 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the second TIVs 609) may be removed by, for example, a wet or dry etching process. For example, in a dry etching process reactants may be directed towards the seed layer using the second TIVs 609 as masks. In another embodiment, etchants may be sprayed or otherwise put into contact with the seed layer in order to remove the exposed portions of the seed layer. After the exposed portion of the seed layer has been etched away, a portion of the first redistribution layers 607 is exposed between the second TIVs 609.

Once the second TIVs 609 have been formed, the first semiconductor structure 500 may be placed on the first redistribution layers 607. In an embodiment the first semiconductor structure 500 may be placed using, e.g., a pick and place process. However, any other method of placing the first semiconductor structure 500 may be used.

FIG. 6 additionally illustrates that, once the first semiconductor structure 500 has been placed, the first semiconductor structure 500 and the second TIVs 609 can be encapsulated with a third encapsulant 611. In an embodiment the first semiconductor structure 500 and second TIVs 609 may be encapsulated using a process similar to the encapsulation of the first semiconductor devices 101 as described above with respect to FIGS. 2A-2B. Once encapsulated, the first semiconductor structure 500 and second TIVs 609 and the third encapsulant 611 may be planarized to expose the first semiconductor structure 500 and the second TIVs 609.

Figure 7:
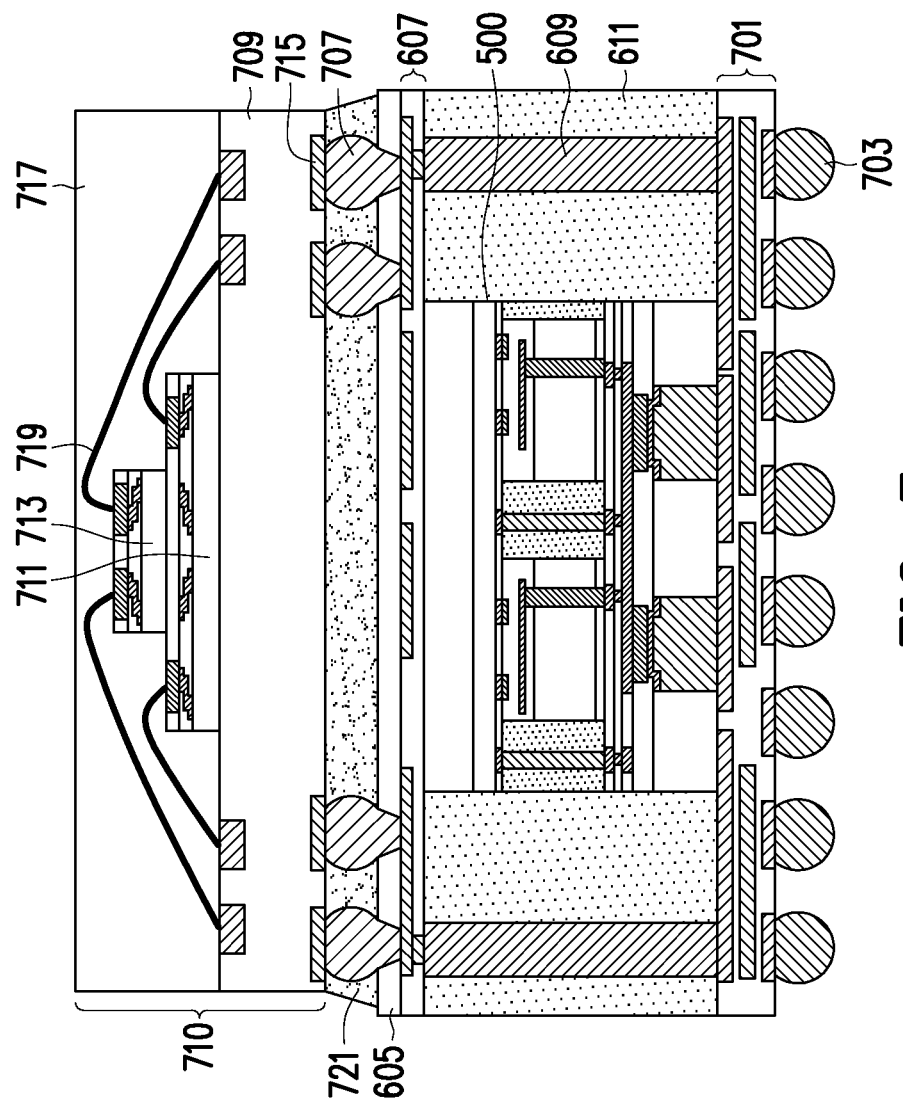
FIG. 7 illustrates a second package, in accordance with some embodiments.

FIG. 7 illustrates that, once the first semiconductor structure 500 and the second TIVs 609 are encapsulated, a second redistribution layer 701 is formed in order to interconnect the first semiconductor structure 500 and the second TIVs 609. In an embodiment the second redistribution layer 701 may be formed similar to the formation of the first redistribution layer 607 (described above with respect to FIG. 6). For example a series of passivation layers and conductive layers are deposited and planarized to form one or more layers of conductive routing. However, any suitable methods and materials may be utilized.

In a particular embodiment, three conductive layers may be formed. However, the use of three conductive layers is intended to be illustrative and is not intended to be limiting. Rather, any suitable number of conductive layers and passivation layers may be utilized, and all such number of layers is fully intended to be included within the scope of the embodiments.

FIG. 7 further illustrates a formation of third external connectors 703 to make electrical contact with the second redistribution layer 701. In an embodiment the third external connectors 703 may be placed on the second redistribution layer 701 and may be a ball grid array (BGA) which comprises a eutectic material such as solder, although any suitable materials may be used. Optionally, an underbump metallization may be utilized between the third external connectors 703 and the second redistribution layer 701. In an embodiment in which the third external connectors 703 are solder bumps, the third external connectors 703 may be formed using a ball drop method, such as a direct ball drop process. In another embodiment, the solder bumps may be formed by initially forming a layer of tin through any suitable method such as evaporation, electroplating, printing, solder transfer, and then performing a reflow in order to shape the material into the desired bump shape. Once the third external connectors 703 have been formed, a test may be performed to ensure that the structure is suitable for further processing.

FIG. 7 also illustrates a debonding of the second carrier substrate 601 from the first semiconductor structure 500. In an embodiment the third external connectors 703 and, hence, the structure including the first semiconductor structure 500, may be attached to a ring structure. The ring structure may be a metal ring intended to provide support and stability for the structure during and after the debonding process. In an embodiment the third external connectors 703 are attached to the ring structure using, e.g., a ultraviolet tape, although any other suitable adhesive or attachment may be used. Once attached, the second adhesion layer 603 may be irradiated and the second adhesion layer 603 and the second carrier substrate 601 may be physically removed.

Once the second carrier substrate 601 has been removed and the polymer layer 605 has been exposed, the polymer layer 605 may be patterned using, e.g., a laser drilling method, by which a laser is directed towards those portions of the polymer layer 605 which are desired to be removed in order to expose the underlying first redistribution layer 607. During the laser drilling process the drill energy may be in a range from 0.1 mJ to about 60 mJ, and a drill angle of about 0 degree (perpendicular to the polymer layer 605) to about 85 degrees to normal of the polymer layer 605.

FIG. 7 additionally illustrates a placement of fourth external connections 707. In an embodiment the fourth external connections 707 may be contact bumps such as microbumps or controlled collapse chip connection (C4) bumps and may comprise a material such as tin, or other suitable materials, such as solder on past, silver, or copper. In an embodiment in which the fourth external connections 707 are tin solder bumps, the fourth external connections 707 may be formed by initially forming a layer of tin through any suitable method such as evaporation, electroplating, printing, solder transfer, ball placement, etc., to a thickness of, e.g., about 100 µm. Once a layer of tin has been formed on the structure, a reflow is performed in order to shape the material into the desired bump shape.

FIG. 7 additionally illustrates a bonding of the fourth external connections 707 to a first package 710. In an embodiment the first package 710 may comprise a third substrate 709, a third semiconductor device 711, a fourth semiconductor device 713 (bonded to the third semiconductor device 711), third contact pads 715 (for electrical connection to the fourth external connections 707), and a second encapsulant 717. In an embodiment the third substrate 709 may be, e.g., a packaging substrate comprising internal interconnects (e.g., through substrate vias) to connect the third semiconductor device 711 and the fourth semiconductor device 713 to the fourth external connections 707.

In another embodiment, the third substrate 709 may be an interposer used as an intermediate substrate to connect the third semiconductor device 711 and the fourth semiconductor device 713 to the fourth external connections 707. In this embodiment the third substrate 709 may be, e.g., a silicon substrate, doped or undoped, or an active layer of a silicon-on-insulator (SOI) substrate. However, the third substrate 709 may also be a glass substrate, a ceramic substrate, a polymer substrate, or any other substrate that may provide a suitable protection and/or interconnection functionality. These and any other suitable materials may be used for the third substrate 709.

The third semiconductor device 711 may be a semiconductor device designed for an intended purpose such as being a logic die, a central processing unit (CPU) die, a memory die (e.g., a DRAM die), combinations of these, or the like. In an embodiment the third semiconductor device 711 comprises integrated circuit devices, such as transistors, capacitors, inductors, resistors, first metallization layers (not shown), and the like, therein, as desired for a particular functionality. In an embodiment the third semiconductor device 711 is designed and manufactured to work in conjunction with or concurrently with the first semiconductor structure 500.

The fourth semiconductor device 713 may be similar to the third semiconductor device 711. For example, the fourth semiconductor device 713 may be a semiconductor device designed for an intended purpose (e.g., a DRAM die) and comprising integrated circuit devices for a desired functionality. In an embodiment the fourth semiconductor device 713 is designed to work in conjunction with or concurrently with the first semiconductor structure 500 and/or the third semiconductor device 711.

The fourth semiconductor device 713 may be bonded to the third semiconductor device 711. In an embodiment the fourth semiconductor device 713 is only physically bonded with the third semiconductor device 711, such as by using an adhesive. In this embodiment the fourth semiconductor device 713 and the third semiconductor device 711 may be electrically connected to the third substrate 709 using, e.g., wire bonds 719, although any suitable electrical bonding may be utilized.

In another embodiment, the fourth semiconductor device 713 may be bonded to the third semiconductor device 711 both physically and electrically. In this embodiment the fourth semiconductor device 713 may comprise fourth external connections (not separately illustrated in FIG. 7) that connect with fifth external connections (also not separately illustrated in FIG. 7) on the third semiconductor device 711 in order to interconnect the fourth semiconductor device 713 with the third semiconductor device 711.

The third contact pads 715 may be formed on the third substrate 709 to form electrical connections between the third semiconductor device 711 and, e.g., the fourth external connections 707. In an embodiment the third contact pads 715 may be formed over and in electrical contact with electrical routing (such as through substrate vias) within the third substrate 709. The third contact pads 715 may comprise aluminum, but other materials, such as copper, may also be used. The third contact pads 715 may be formed using a deposition process, such as sputtering, to form a layer of material (not shown) and portions of the layer of material may then be removed through a suitable process (such as photolithographic masking and etching) to form the third contact pads 715. However, any other suitable process may be utilized to form the third contact pads 715. The third contact pads 715 may be formed to have a thickness of between about 0.5 μm and about 4 μm, such as about 1.45 μm.

The second encapsulant 717 may be used to encapsulate and protect the third semiconductor device 711, the fourth semiconductor device 713, and the third substrate 709. In an embodiment the second encapsulant 717 may be a molding compound and may be placed using a molding device (not illustrated in FIG. 7). For example, the third substrate 709, the third semiconductor device 711, and the fourth semiconductor device 713 may be placed within a cavity of the molding device, and the cavity may be hermetically sealed. The second encapsulant 717 may be placed within the cavity either before the cavity is hermetically sealed or else may be injected into the cavity through an injection port. In an embodiment the second encapsulant 717 may be a molding compound resin such as polyimide, PPS, PEEK, PES, a heat resistant crystal resin, combinations of these, or the like.

Once the second encapsulant 717 has been placed into the cavity such that the second encapsulant 717 encapsulates the region around the third substrate 709, the third semiconductor device 711, and the fourth semiconductor device 713, the second encapsulant 717 may be cured in order to harden the second encapsulant 717 for optimum protection. While the exact curing process is dependent at least in part on the particular material chosen for the second encapsulant 717, in an embodiment in which molding compound is chosen as the second encapsulant 717, the curing could occur through a process such as heating the second encapsulant 717 to between about 100° C. and about 130° C., such as about 125° C. for about 60 sec to about 3000 sec, such as about 600 sec. Additionally, initiators and/or catalysts may be included within the second encapsulant 717 to better control the curing process.

However, as one having ordinary skill in the art will recognize, the curing process described above is merely an exemplary process and is not meant to limit the current embodiments. Other curing processes, such as irradiation or even allowing the second encapsulant 717 to harden at ambient temperature, may be used. Any suitable curing process may be used, and all such processes are fully intended to be included within the scope of the embodiments discussed herein.

Once the fourth external connections 707 have been formed, the fourth external connections 707 are aligned with and placed into physical contact with the third contact pads 715, and a bonding is performed. For example, in an embodiment in which the fourth external connections 707 are solder bumps, the bonding process may comprise a reflow process whereby the temperature of the fourth external connections 707 is raised to a point where the fourth external connections 707 will liquefy and flow, thereby bonding the first package 710 to the fourth external connections 707 once the fourth external connections 707 resolidifies.

FIG. 7 also illustrates a placement of an underfill material 721 between the first package 710 and the second redistribution layer 705. In an embodiment the underfill material 721 is a protective material used to cushion and support the first package 710 from operational and environmental degradation, such as stresses caused by the generation of heat during operation. The underfill material 721 may be injected or otherwise formed in the space between the first package 710 and the second redistribution layer 705 and may, for example, comprise a liquid epoxy that is dispensed between the first package 710 and the second redistribution layer 705 and then cured to harden.

FIG. 7 additionally illustrates a singulation. In an embodiment the singulation may be performed by using a saw blade (not separately illustrated) to slice through the underfill material 721 and the third encapsulant 611. However, as one of ordinary skill in the art will recognize, utilizing a saw blade for the singulation is merely one illustrative embodiment and is not intended to be limiting. Any method for performing the singulation, such as utilizing one or more etches, may be utilized. These methods and any other suitable methods may be utilized to singulate the structure.

By utilizing the embodiments as discussed herein, a high performance and low cost structure may be manufactured. In particular, by integrating system on chip devices with a wide I/O DRAM device using, e.g., hybrid bonding, pathways between the devices are shortened, allowing for a higher performance. Additionally, by utilizing integrated fan out technology, the structure can also incorporate other packages, allowing the device to better route desired functionalities (e.g., memory distributions) between different devices based on the desired performance.

Figure 8:
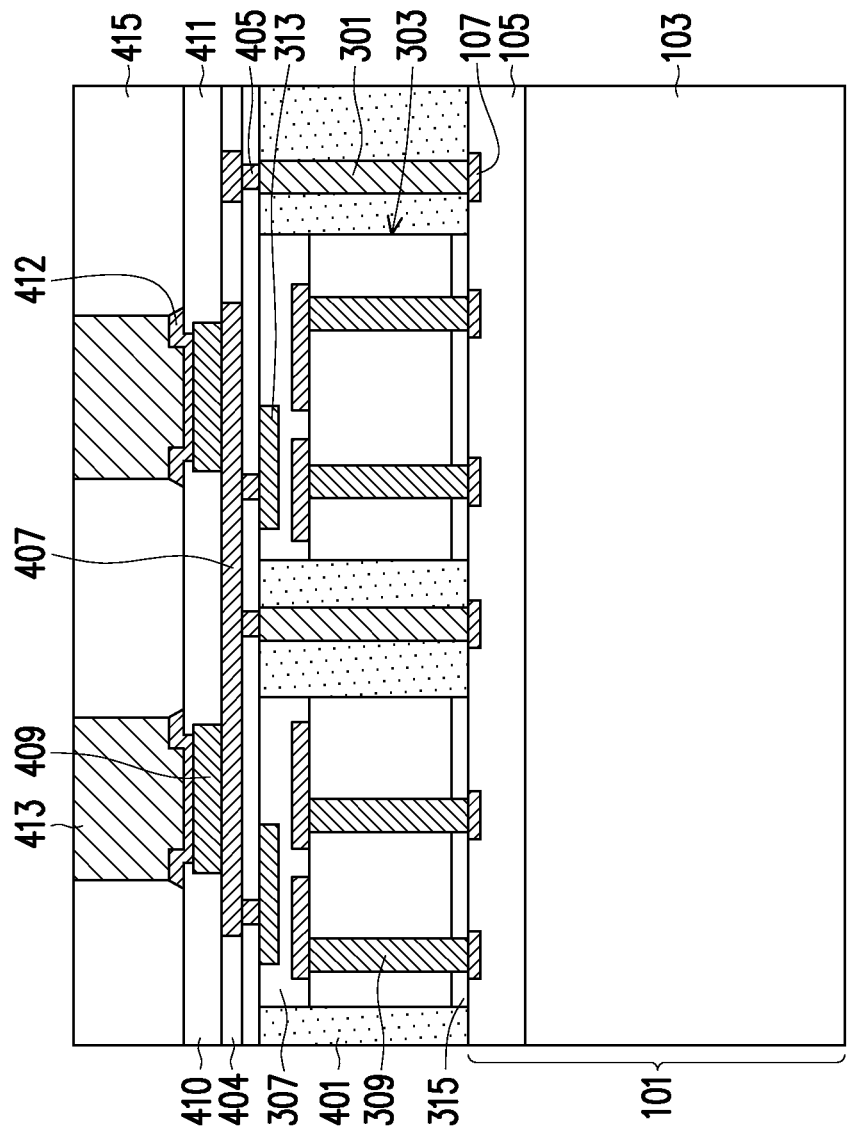
FIG. 8 illustrates a back-to-face bonding configuration, in accordance with some embodiments.

FIG. 8 illustrates another embodiment in which the second semiconductor devices 303 are attached to the first semiconductor device 101 in a back to face configuration. In this embodiment, rather than bonding the second wafer bond layers 311 and the second conductive wafer bond material 313 to the first semiconductor device 101 (as described above with respect to FIG. 4), the TSVs 309 and passivation layer 315 are bonded to the first semiconductor device 101. In an embodiment the TSVs 309 and passivation layer 315 may be bonded to the first semiconductor device 101 using, e.g., a hybrid bonding process, as described above with respect to FIG. 4. For example, surfaces of the passivation layer 315 and the TSVs 309 may be activated, the passivation layer 315 and the TSVs 309 are placed into physical contact with the first semiconductor device 101, and a heating process is conducted. However, any suitable bonding process may be utilized.

Additionally, once the second semiconductor devices 303 have been bonded in the back to face configuration, the remainder of the process steps may be performed as described above with respect to FIGS. 4-7. In particular, the second encapsulant 401 is placed (see, e.g., FIG. 4), the first external connectors 413 are formed (see, e.g., FIG. 4), the first semiconductor structure 500 may be placed and encapsulated with the second TIVs 609 (see, e.g., FIG. 6), and the first package 710 may be bonded (see, e.g., FIG. 7). However, any suitable steps may be utilized.

By utilizing a back to face configuration or any suitable combination of face to face and back to face configurations, the process windows for manufacturing can be kept open. In particular, keeping the number of combinations as wide as possible allows a designer to redesign the manufacturing process in the best method for yield, costs, and time.

In accordance with an embodiment, a semiconductor device includes: a first system on chip device bonded to a first memory device; a second system on chip device bonded to the first memory device; a first encapsulant surrounding the first system on chip device and the second system on chip device; a second encapsulant surrounding the first system on chip device, the second system on chip device, and the first memory device; and a through via extending from a first side of the second encapsulant to a second side of the first encapsulant, the through via being located outside of the first encapsulant. In an embodiment, the semiconductor device further includes a first redistribution layer in physical contact with both the first system on chip device and the through via. In an embodiment, the semiconductor device further includes a second redistribution layer in physical contact with the through via, the second redistribution layer being on an opposite side of the first memory device than the first redistribution layer. In an embodiment, the first system on chip device is bonded to the first memory device using a hybrid bond. In an embodiment, the first system on chip device is bonded to the first memory device in a face-to-face configuration. In an embodiment, the first system on chip device is bonded to the first memory device in a back-to-face configuration. In an embodiment, the first encapsulant is a molding compound.

In accordance with another embodiment, a semiconductor device includes: a first package electrically connected to a through via; a first redistribution layer electrically connected to the through via; a first system on chip device electrically connected to the first redistribution layer; a second system on chip device electrically connected to the first redistribution layer; a memory device bonded to the first system on chip device and the second system on chip device; a first encapsulant surrounding the first system on chip device and the second system on chip device; and a second encapsulant surrounding the through via, the first system on chip device, the second system on chip device, the memory device, and the first encapsulant. In an embodiment, the memory device is a wide I/O memory device. In an embodiment, the first system on chip device is a logic device. In an embodiment, the semiconductor device further includes a second through interposer via extending through the first encapsulant and in physical contact with the memory device. In an embodiment, the memory device is bonded to the first system on chip device in a face-to-face configuration. In an embodiment, the memory device is bonded to the first system on chip device in a back-to-face configuration. In an embodiment, the memory device is bonded to the first system on chip device with a hybrid bond.

In yet another embodiment, a method of manufacturing a semiconductor device, the method includes: providing a memory device; bonding a first system on chip device to the memory device; bonding a second system on chip to the memory device; encapsulating the first system on chip device and the second system on chip with a first encapsulant; after the encapsulating, bonding the first system on chip device and the second system on chip to a redistribution layer, the redistribution layer being electrically connected to a through via; and encapsulating the through via, the first system on chip device and the second system on chip device with a second encapsulant. In an embodiment, the providing the memory device comprises receiving the memory device from a manufacturer. In an embodiment, the providing the memory device comprises forming a re-constructed wafer. In an embodiment, the bonding the first system on chip device comprises hybrid bonding the first system on chip device to the memory device. In an embodiment, the hybrid bonding includes: activating a surface of the first system on chip device; and physically contacting the surface of the first system on chip device with the memory device. In an embodiment, the first encapsulant is a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    bonding a first system on chip device to a first memory device, the first system on chip device comprising a first passivation layer;
    bonding a second system on chip device to the first memory device, the second system on chip device comprising a second passivation layer;
    forming a through via over the first memory device;
    after the forming the through via, encapsulating with a first encapsulant the first system on chip device, the second system on chip device, and the through via, wherein the first passivation layer of the first system on chip device, the second passivation layer of the second system on chip device, the first memory device, and the first encapsulant share a planar surface;
    forming a first redistribution layer;
    placing the first memory device onto the first redistribution layer;
    encapsulating with a second encapsulant the first system on chip device, the second system on chip device, and the first memory device;
    forming a second redistribution layer over and in physical contact with both the first system on chip device and the through via; and
    attaching a first package to the first redistribution layer with external connections, wherein the external connections are the only external connections on the first redistribution layer.

2. The method of claim 1, wherein bonding the first system on chip device to the first memory device is performed using a hybrid bond.

3. The method of claim 2, wherein the using the hybrid bond comprises:
    activating a surface of the first system on chip device; and
    physically contacting the surface of the first system on chip device with the first memory device.

4. The method of claim 3, wherein the bonding the first system on chip device to the first memory device bonds in a face-to-face configuration.

5. The method of claim 3, wherein the bonding the first system on chip device to the first memory device bonds in a back-to-face configuration.

6. The method of claim 1, wherein the first encapsulant is a molding compound.

7. The method of claim 1, wherein the first memory device is a wide I/O memory device.

8. A method of manufacturing a semiconductor device, the method comprising:
    encapsulating a first system on chip device and a second system on chip device with a first encapsulant, wherein a memory device is bonded to both the first system on chip device and the second system on chip device, wherein the memory device is a wide I/O memory device, wherein a first through via extending through the first system on chip device, a second through via located adjacent to the first system on chip device, a first passivation layer located within the first system on chip device, and the first encapsulant share a planar surface;
    forming a third through; via on a substrate;
    placing the first system on chip device and the second system on chip device adjacent to the third through; via on the substrate;
    encapsulating the third through via, the first system on chip device, and the second system on chip device with a second encapsulant;
    forming a first redistribution layer electrically connected to the third through via, the first system on chip device, and the second system on chip device; and
    connecting a first package to a second redistribution layer located on an opposite side of the third through via from the first redistribution layer, wherein each external connector located on the second redistribution layer is located between the first package and the second redistribution layer.

9. The method of claim 8, wherein the first system on chip device is a logic device.

10. The method of claim 8, wherein the encapsulating the first system on chip device and the second system on chip device with the first encapsulant further encapsulates a second through interposer via in physical contact with the memory device.

11. The method of claim 8, wherein the memory device is bonded to the first system on chip device in a face-to-face configuration.

12. The method of claim 8, wherein the memory device is bonded to the first system on chip device in a back-to-face configuration.

13. The method of claim 8, wherein the memory device is bonded to the first system on chip device with a hybrid bond.

14. A method of manufacturing a semiconductor device, the method comprising:
    providing a memory device, wherein the providing the memory device comprises forming a re-constructed wafer;
    bonding a first system on chip device to the memory device, the first system on chip device comprising a first passivation layer;
    bonding a second system on chip device to the memory device, the second system on chip device comprising a second passivation layer;
    forming a through via directly onto the memory device;
    after the forming the through via, encapsulating the first system on chip device and the second system on chip device with a first encapsulant such that the first passivation layer of the first system on chip device, the second passivation layer of the second system on chip device, the through via, and the first encapsulant share a coplanar surface;
    attaching the memory device to a first redistribution layer;
    encapsulating the through via, the first system on chip device and the second system on chip device with a second encapsulant;
    connecting the first system on chip device and the second system on chip device to a second redistribution layer, the second redistribution layer located on an opposite side of the memory device from the first redistribution layer and being electrically connected to the through via; and
    attaching a package to the first redistribution layer, wherein after the attaching the package, the package extends over each solder ball located on the first redistribution layer.

15. The method of claim 8, wherein the memory device is bonded to the second system on chip device with a second hybrid bond.

16. The method of claim 14, wherein the providing the memory device comprises receiving the memory device from a manufacturer.

17. The method of claim 14, wherein the bonding the first system on chip device comprises hybrid bonding the first system on chip device to the memory device.

18. The method of claim 17, wherein the hybrid bonding comprises:
    activating a surface of the first system on chip device; and
    physically contacting the surface of the first system on chip device with the memory device.

19. The method of claim 14, wherein the first encapsulant is a dielectric material.

20. The method of claim 14, wherein the first encapsulant is a molding compound.

* * * * *